United States Patent [19]

Fujishima et al.

[11] Patent Number: 4,658,379
[45] Date of Patent: Apr. 14, 1987

[54] SEMICONDUCTOR MEMORY DEVICE WITH A LASER PROGRAMMABLE REDUNDANCY CIRCUIT

[75] Inventors: Kazuyasu Fujishima, Itami; Kazuhiro Shimotori, Toyonaka; Hideyuki Ozaki, Nishinomiya; Hideshi Miyatake; Masahiro Tomisato, both of Itami, all of Japan

[73] Assignee: Mitsubishi Denki Kabushiki Kaisha, Tokyo, Japan

[21] Appl. No.: 666,380

[22] Filed: Oct. 30, 1984

[30] Foreign Application Priority Data

Dec. 15, 1983 [JP] Japan .................. 58-238610

[51] Int. Cl.$^4$ ............................................. G11C 7/00
[52] U.S. Cl. ..................... 365/200; 365/203
[58] Field of Search ................... 365/200, 203

[56] References Cited

U.S. PATENT DOCUMENTS 4,538,247  8/1985  Venkateswaran .................. 365/200

OTHER PUBLICATIONS

"Laser Programmable Redundancy and Yield Improvement in 64K DRAM", Smith et al, IEEE Journal, Oct. 1981.
"A Low-Power Sub 100 ns 256K Bit Dynamic RAM", Fujii et al, IEEE Journal, Oct. 1983.
"A 256K Dynamic RAM with Page-Nibble Modes", Fujishima et al, IEEE Journal, Oct. 1983.

Primary Examiner—James W. Moffitt
Attorney, Agent, or Firm—Birch, Stewart, Kolasch and Birch

[57] ABSTRACT

A semiconductor memory device with a laser programmable redundancy circuit, which includes: a plurality of decoders for selecting a row or column of the memory; at least one spare decoder which is selected instead of a decoder connected to a faulty memory cell; a link element inserted in series with the precharging transistor and connected between the power supply and the decoder output line; a signal generator which generates a non-selection signal for making the object decoder unselected only when a spare decoder is selected, the signal generator being provided in the spare decoder; and a transistor, having a gate to which the non-selection signal is input, with the drain and the source thereof being connected to the decoder output and ground, respectively, the transistor being provided in the decoder.

5 Claims, 30 Drawing Figures

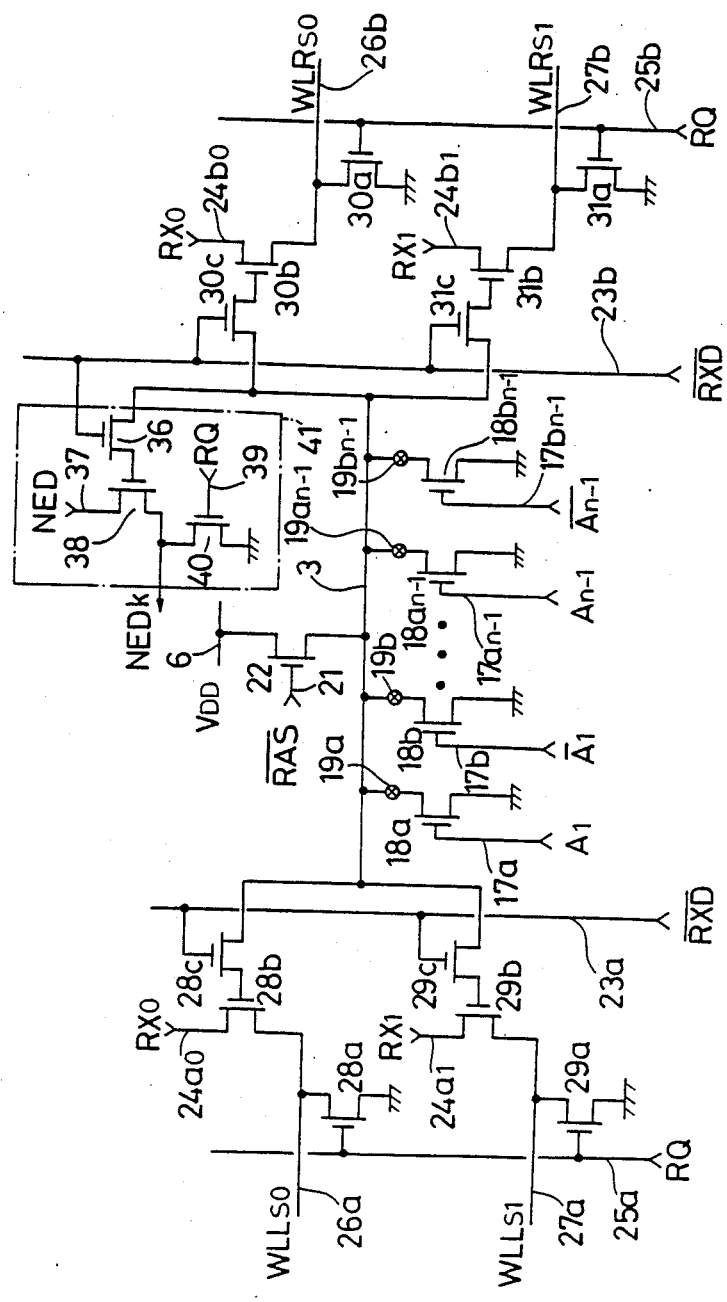
F I G. 3(b).

SEMICONDUCTOR MEMORY DEVICE WITH A LASER PROGRAMMABLE REDUNDANCY CIRCUIT

FIELD OF THE INVENTION

The present invention relates to a semiconductor memory device with a laser programmable redundancy circuit.

BACKGROUND OF THE INVENTION

Recently, technology using a laser to replace defective elements by redundant (spare) rows or columns has been developed. A pioneer work of such device is reported in an article "Laser Programmable Redundancy and Yield Improvement in a 64K DRAM", IEEE J. Solid-State Circuits, vol. SC-16, pp. 506-513, Oct. 1981 by R. T. Smith et al.

This article points out the following three items as problems in irradiating a laser beam to a link element, which are especially important in highly integrated circuits:

(1) laser spot size,
(2) dimension of the link element, and
(3) distance between the link elements.

Further prior art relating to such technology is reported in an article "A 256K Dynamic RAM with Page-Nibble Mode", IEEE J. Solid-State Circuits, vol. SC-18, pp. 470-478, Oct. 1983, by K. Fujishima et al.

FIG. 1(a) and (b) are schematic diagrams showing the row decoder and the spare row decoder of the semiconductor memory device with laser programmable redundancy construction shown in the article. In the row decoder for selecting a word line shown in FIG. 1(a), the reference numerals $1a_1$ to $1a_{n-1}$ designate address signal lines to which the address signals $A_1$ or $\overline{A}_1$ to $A_{n-1}$ or $\overline{A}_{n-1}$ are input. The reference numerals $2a_a$ to $2a_{n-1}$ designate transistors to the gates whereof the address signals $A_1$ or $\overline{A}_1$ to $A_{n-1}$ or $\overline{A}_{n-1}$ are input. The reference numeral 3 designates a decoder output line. The numeral 4 designates a $\overline{RAS}$ signal line to which the row address strobe ($\overline{RAS}$) signal shown in FIG. 2(a) is input. The numeral 5 designates a transistor to the gate whereof the $\overline{RAS}$ signal is input. The numeral 6 designates a power supply line of voltage $V_{DD}$. The numerals 7a and 7b designate $\overline{RXD}$ signal lines to which the $\overline{RXD}$ signal for separating the decoder and the word line shown in FIG. 2(f) is input. The reference numerals $8a_0$ and $8a_1$, $8b_0$ and $8b_1$ designate $RX_0$ and $RX_1$ signal lines, respectively, to which the sub-decode signals $RX_0$ and $RX_1$ (refer to FIG. 2(d)) generated from the word line driving signal (RX signal) are input, respectively. The reference numerals 9a and 9b designate RQ signal lines to which the RQ signal for clamping the unselected word line to the ground level shown in FIG. 2(g) is input. The reference numerals 10a and 10b designate the n-th left word line (referred also as $WLL_n$) and the n-th right word line (referred also as $WLR_n$). The numerals 11a and 11b designate the (n+1)-th left and right word lines ($WLL_{n+1}$, $WLR_{n+1}$). The reference numerals 12a to 12c, 13a to 13c, 14a to 14c, and 15a to 15c designate transistors. The reference numerals 16a to 16d designate link elements which will be melted by a laser beam when the memory cells selected by the word lines are faulty so as to make the faulty word lines unselected.

Furthermore, in the spare decoder shown in FIG. 1(b), the reference numerals $17a_1$, $17b_1$, to $17a_{n-1}$, $17b_{n-1}$ designate address signal lines to which the address signals $A_1$, $\overline{A}_1$ to $A_{n-1}$, $\overline{A}_{n-1}$ are input. The reference numerals $18a$, $18b$ to $18a_{n-1}$, $18b_{n-1}$ designate transistors to the gate whereof the address signals $A_1$, $\overline{A}_1$ to $A_{n-1}$, $\overline{A}_{n-1}$ are input. The numerals 19a, 19b to $19a_{n-1}$, $19b_{n-1}$ designate link elements. The numeral 20 designates a decoder output line. The numeral 21 designates a $\overline{RAS}$ signal line to which the $\overline{RAS}$ signal is input. The numeral 22 designates a transistor to the gate whereof the $\overline{RAS}$ signal is input. The numeral 23a and 23b designate $\overline{RXD}$ signal lines to which the $\overline{RXD}$ signal for separating the decoder and the word line is input. The numerals $24a_0$, $24a_1$ and $24b_0$, $24b_1$ designate $RX_0$ and $RX_1$ signal lines to which the sub-decode $RX_0$ and $RX_1$ signals are input, respectively. The numerals 25a and 25b designate RQ signal lines to which the RO signal is input. The numerals 26a and 26b designate first left and right word lines (referred also as $WLL_{s0}$, $WLR_{s0}$). The numerals 27a and 27b designate second left and right word lines (referred also as $WLL_{s1}$, $WLR_{s1}$). The numerals 28a to 28c, 29a to 29c, 30a to 30c, and 31a to 31c designate transistors, and the numerals 32a to 32d designate link elements.

The device will be operated as follows:

At first, pre-chargings of all the decoders are executed while the $\overline{RAS}$ signal shown in FIG. 2(a) is at "H" level. After the $\overline{RAS}$ signal becomes "L" level, an address is selected. For example, the address signals Ai, $\overline{Ai}$ shown in FIG. 2(b) are generated, and the output lines 3 of all the decoders except for the selected decoder are discharged. The output line 3 of the selected decoder is maintained at "H" level, and the word lines at the left and right side of the decoder are selectively driven by the sub-decode $RX_0$ or $RX_1$ signals (refer to FIG. 2(d) which shows a case where decoded by the signal $A_0$) generated from the word line driving RX signal shown in FIG. 2(c). The word line driving WL signal which is selectively driven becomes "H" level as shown in FIG. 2(e). When the memory cell (not shown) selected by the word line has a fault, the link element which is connected to the word line is melted by a laser beam, thereby making the word line unselected. On the other hand, in the spare decoder shown in FIG. 1(b), the link element which corresponds to each bit of the address of the faulty memory cell, that is, either of each pair of link elements 19a and 19b to $19n_{a-1}$ and $19b_{n-1}$ is melted by a laser beam, and the row decoder which is connected to the faulty word line is replaced by the spare row decoder.

Under the semiconductor memory device of such construction, however, the link element for separating the faulty word line from the decoder and making the faulty word line unselected must be provided for each word line. Accordingly, in a highly integrated memory device such as a dynamic RAM having more than 256K or 1M bits the requirements for the positioning accuracy of the laser beam and the laser spot size become severe, thereby making it difficult to realize the same in practical use.

Another prior art device is reported in an article "A Low-Power Sub 100ns 256K Bit Dynamic RAM", IEEE J. Solid-State Circuits, vol. SC-18, pp. 441-446, Oct. 1983, by S. Fujii et al. In this device, a link element is not provided for each word line, being appropriate for high integration. However, the operational speed is disadvantageously low.

OBJECTS AND SUMMARY OF THE INVENTION

One object of the present invention is to provide a semiconductor memory device with a laser programmable redundancy circuit capable of reducing the strict requirements for the positioning accuracy of the laser beam and the laser spot size.

Another object of the present invention is to provide a semiconductor memory device with a laser programmable redundancy circuit capable of realizing high integration.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor memory device with a laser programmable redundancy circuit, wherein a non-selection signal is generated when a spare decoder is selected instead of the decoder, and the signal turns off the transistor connected between the decoder output line and the earth so as to make the decoder unselected, thereby making it unnecessary to provide a link element for each word line.

DETAILED DESCRIPTION OF THE PREFERRED EMBODIMENTS

Figure 1A:
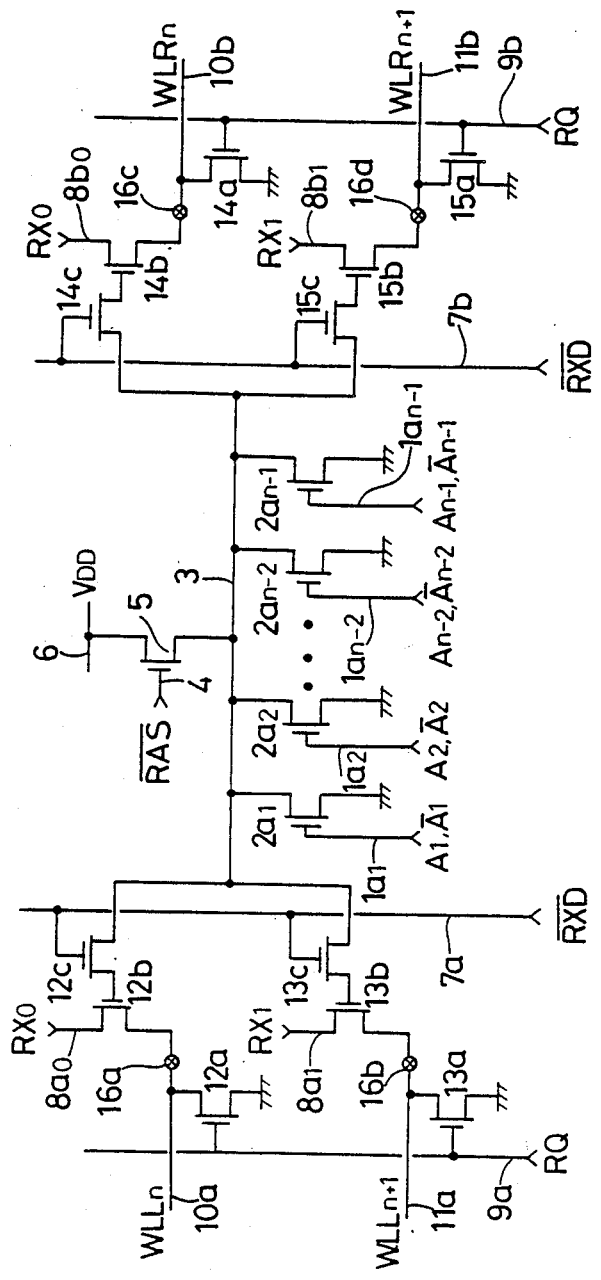
FIGS. 1(a) and (b) are schematic diagrams showing the row decoder and the spare row decoder of a prior art semiconductor memory device with laser programmable redundancy.
Figure 1B:
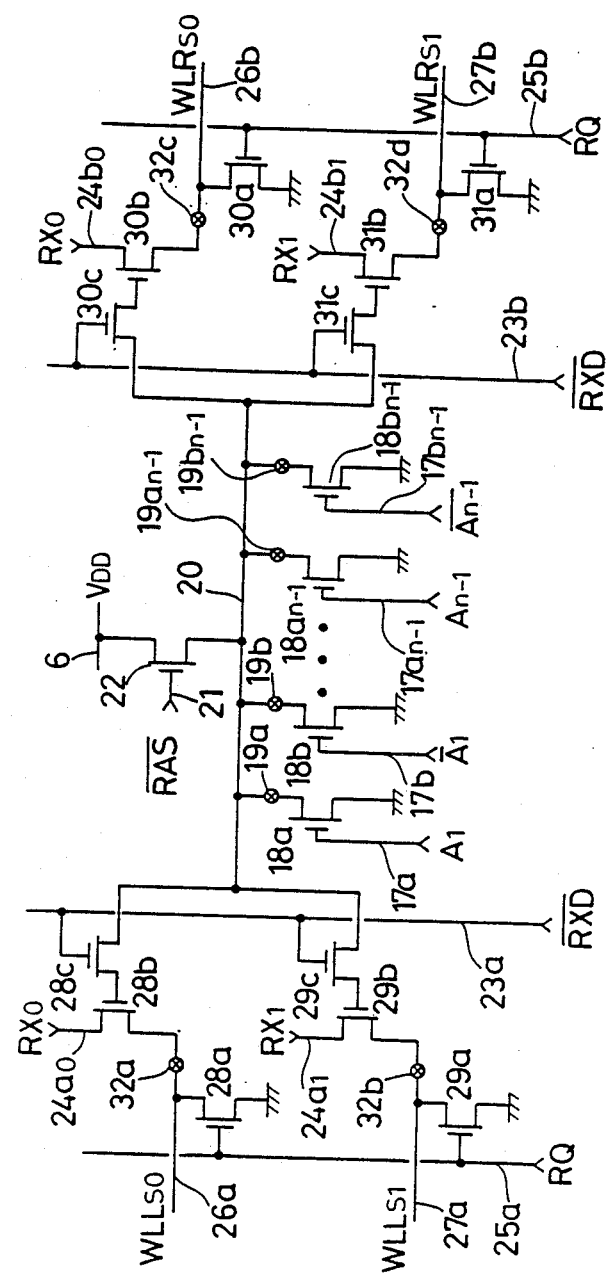
Figure 2:
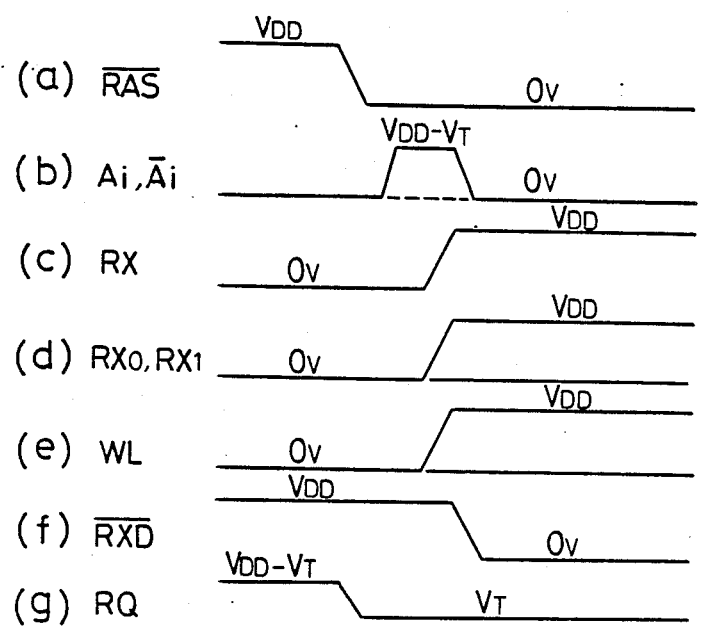
FIGS. 2(a) to (g) are timing diagrams exemplifying the operation of the device of FIGS. 1(a) and (b)
Figure 3A:
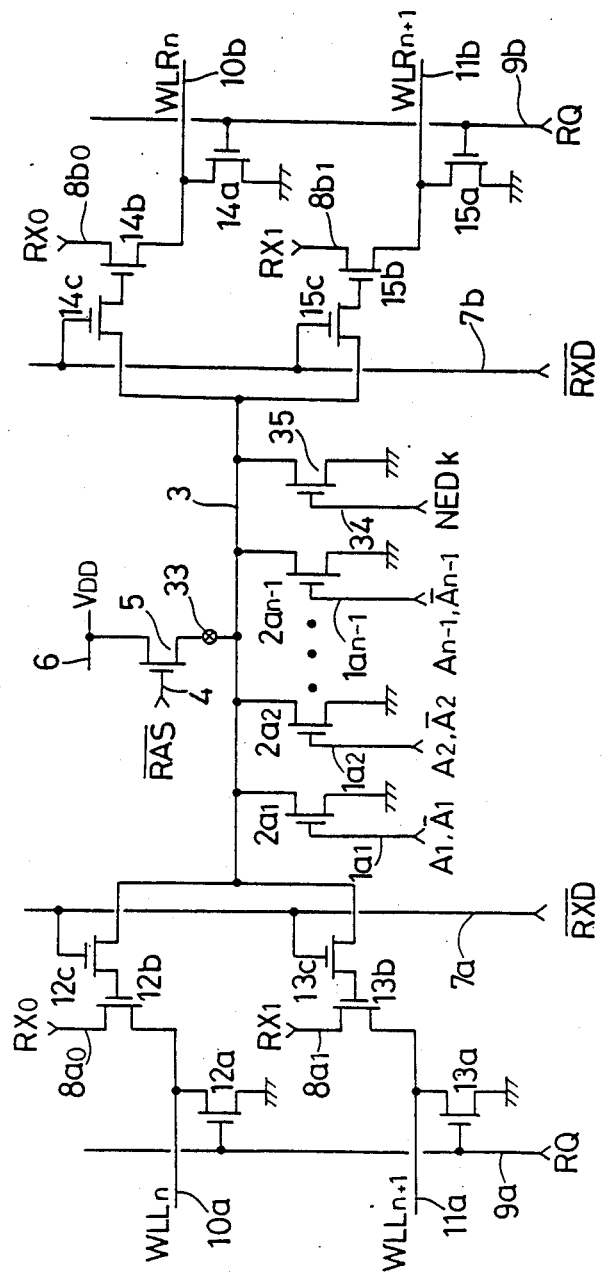
FIGS. 3(a) and (b) are schematic diagrams showing the row decoder and the spare row decoder of one embodiment of the present invention.
Figure 4:
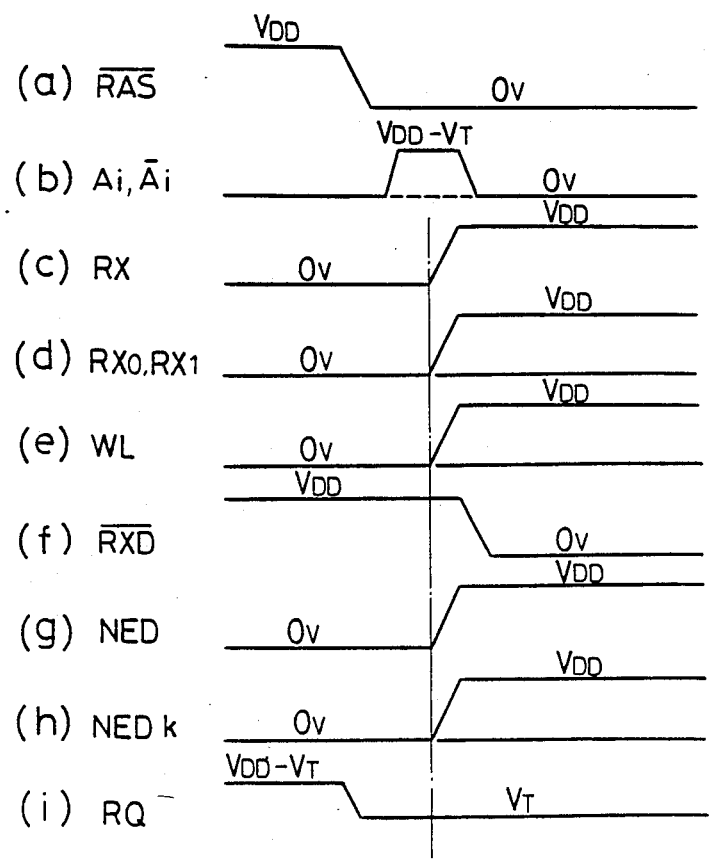
FIGS. 4(a) to (i) are timing diagrams exemplifying the operation of the device of FIGS. 3(a) and (b)

Referring to FIGS. 3(a) and (b), one embodiment of the present invention will be described in detail in the following:

In the FIGS. 3(a) and (b), which show the row decoder and the spare decoder of one embodiment of the present invention, the reference numeral 33 designates a link element capable of being melted by a laser beam, which element is connected to the transistor 5 in series so as to pre-charge the decoder output line 3. The reference numeral 34 designates an $NED_K$ signal line to which the $NED_K$ signal shown in FIG. 4(h) is input, wherein the $NED_K$ signal is generated when the space row decoder is selected, that is, the replacement is executed. The numeral 35 designates a transistor connected between the decoder output line 3 and the earth, to the gate whereof the $NED_K$ signal is input. The reference numeral 36 designates a transistor the drain whereof is connected to the decoder output line 3 and the gate whereof is connected to the $\overline{RXD}$ signal line 23b. The numeral 37 designates a NED signal line to which the NED signal shown in FIG. 4(g) is input. The numeral 38 designates a transistor the drain whereof is connected to the NED signal line 37, the gate whereof is connected to the source of the transistor 36, and the source whereof is connected to the $NED_K$ output terminal (not shown). The numeral 39 designates an RQ signal line to which the RQ signal shown in FIG. 4(i) is input. The numeral 40 designates a transistor the drain whereof is connected to the $NED_K$ signal output terminal (not shown), the gate whereof is connected to the RQ signal line 39, and the source whereof is connected to the ground level Vss. Besides, the numeral 41 designates a $NED_K$ signal generator for generating the $NED_K$ signal shown in FIG. 5(h), wherein the generator is constituted by the transistors 36, 38, and 40.

The device will be operated as follows:

At first, pre-chargings of all decoders are executed while the $\overline{RAS}$ signal shown in FIG. 4(a) is at "H" level. After $\overline{RAS}$ signal becomes "L" level, the address is selected. For example, the address signals Ai, $\overline{Ai}$ shown in FIG. 4(b) are generated, and the output lines 3 of all decoders except for the selected decoder are discharged. The output line 3 of the selected decoder is maintained at "H" level, and the word lines at the left and the right side of the decoder are selectively driven by the sub-decode $RX_0$ or $RX_1$ signal generated from the word line driving RX signal shown in FIG. 4(c) (refer to FIG. 4(d) which shows a case where decoded by the signal $A_0$). The word line driving WL signal which is selectively driven becomes "H" level as shown in FIG. 4(e). Thereafter, when the memory cell (not shown) selected by the word line has a fault, the link element 33 is melted and the pre-charging of the decoder is halted. Due to the halting of the pre-charging, the decoder output line 3 which is connected to this faulty cell (not shown) does not have a charging path, whereby it is held at "L" level. Thus, the word line surely becomes unselected state. The decoder output line 3 is held at "L" level by the address input while the decoder is not selected. On the other hand, when the address input is to select this decoder, that is, all bits of the address input are "L" level, the $NED_K$ signal becomes "H" level as shown in FIG. 4(h), whereby the decoder output line 3 is prevented from floating up by the capacity coupling when the sub-decode $RX_0$ and $RX_1$ signals are input. If a decoder circuit does not include the transistor 35, the transistors (12b and 14b) or (13b and 15b) to which the "H" signal among the two sub-decode $RX_0$ and $RX_1$ signals is input are turned on for an instant by the capacities between the drains and the gates thereof. By this, the word line becomes "H" for an instant regardless that the precharging is halted, thereby giving rise to a malfunction of the decoder. To the contrary, in this embodiment when either of the $RX_0$, $RX_1$ signals is "H" a path for discharging the decoder output line to the earth is formed through the transistor 35 and it also discharges the gates of the above transistors, and therefore the above transistors will not be turned on erroneously.

When the faulty cell (not shown) is made unselected, that is, the selected decoder is replaced by the spare decoder, either of each pair of the link elements 19a and 19b, . . . $19a_{n-1}$ and $19b_{n-1}$ corresponding to the address signal lines 17a, 17b to $17a_{n-1}$, $17b_{n-1}$ is melt, and the decoder output line 3 of the spare decoder to be replaced becomes "H" level only when the spare decoder is selected. Accordingly, the $NED_K$ signal is generated only when the decoder is replaced by a spare decoder. Besides, in this embodiment the $NED_K$ signal can be generated for each spare decoder, thereby enabling the provision of a desired number of redundancy circuits.

Figure 5:
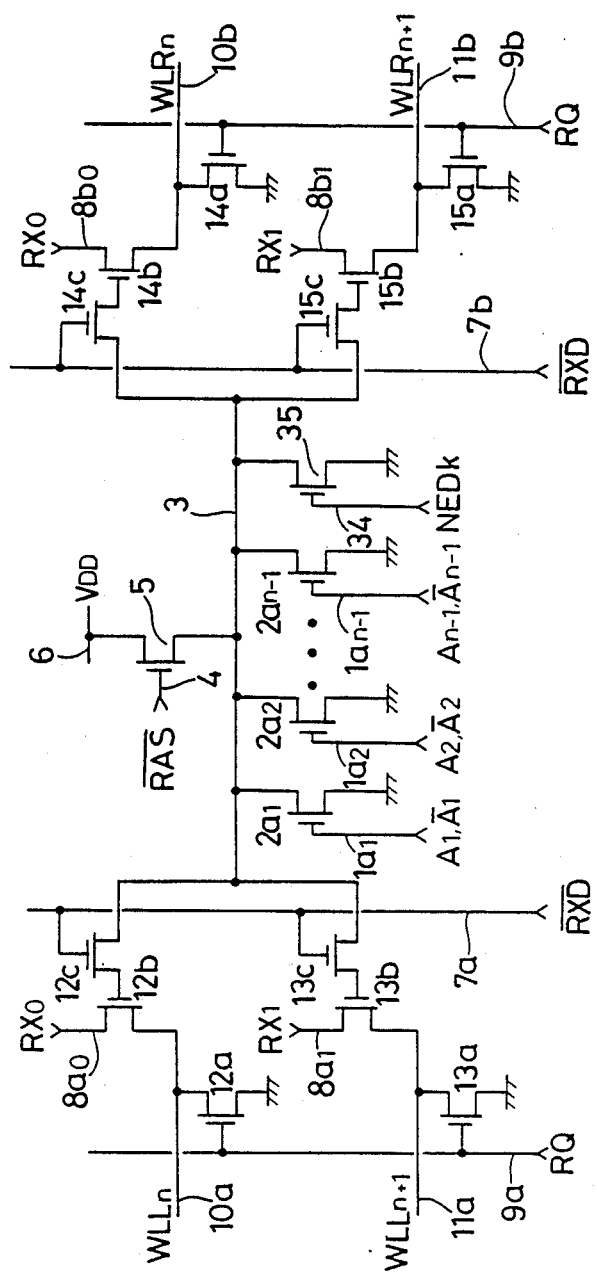
FIG. 5 is a schematic diagram showing the row decoder of the prior art.
Figure 6:
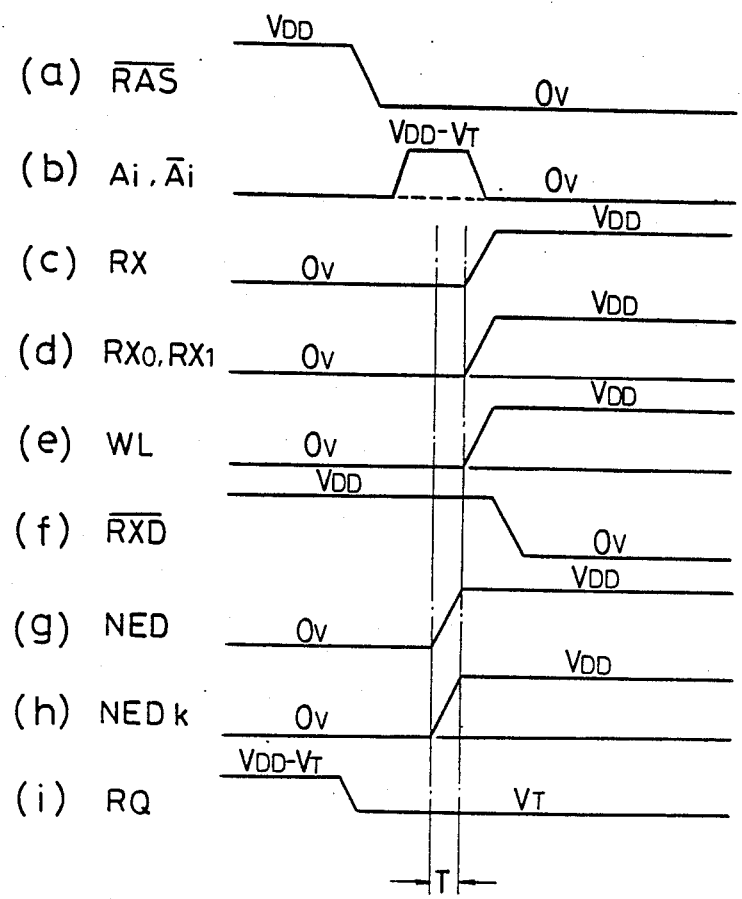
FIGS. 6(a) to (i) are timing diagrams exemplifying the operation of the device of FIG. 5 and FIG. 3(b).

Another embodiment of the row decoder according to the prior art is shown in FIG. 5. Also in this case the spare decoder shown in FIG. 3(b) is used. In this row decoder, the circuit construction except for the transistor 35 to the gate whereof the $NED_K$ signal is input is the same as the decoder with no redundancy circuit, and it is unnecessary to provide a link element capable of being melt commonly used in a usual decoder. The timing diagrams in this case are shown in FIG. 6(a) to (i). This circuit is inferior in the operational speed by the time interval t (the time required for the decoder being discharged by the $NED_K$ signal) to the construction with no redundancy or the construction with redundancy described above, but it is unnecessary to provide a link element commonly used in a usual decoder. Furthermore, the $NED_K$ signal can be generated for each spare decoder, thereby enabling the provision of a desired number of redundancy circuits. Hereupon, the operation of the circuit is the same as that of the row decoder and the spare row decoder shown in FIG. 3(a) and (b).

In the above illustrated embodiment a construction with redundancy in rows is described, but it is, of course, possible to provide a construction with redundancy in columns.

According to the present invention, a non-selection signal is generated when a spare decoder is selected instead of the decoder, and the signal turns off the transistor connected between the decoder output line and the earth so as to make the decoder unselected. This makes it unnecessary to provide a link element for each word line, thereby reducing the requirements for the positional accuracy of the laser beam and the beam spot size. This permits realization of a highly integrated memory device.

What is claimed is:

1. A semiconductor memory device with a laser programmable redundancy circuit, which comprises:

a plurality of decoders for selecting a row or a column of the memory, each decoder including a decoder output line, a precharging transistor connected to a power supply and a selectively disconnecting link element disposed in series with said precharging transistor and connecting said precharging transistor to said decoder output line; and at least one spare decoder which is selected instead of a decoder connected to a faulty memory cell wherein said selectively disconnecting link element selectively disconnects said precharging transistor and said decoder output line when said spare decoder is selected instead of said decoder that is connected to a faulty memory cell thereby preventing a precharge of said decoder output line.

2. The semiconductor memory device of claim 1, wherein said selectively disconnecting link element is capable of being melted by a laser beam so as to selectively disconnect said precharging transistor and said decoder output line.

3. The semiconductor memory device of claim 1 wherein each decoder includes a selection transistor having a first active electrode connected to said decoder output line and a second active electrode connected to ground, and wherein said at least one spare decoder includes a signal generator that generates a non-selection signal when said spare decoder is selected instead of said decoder connected to a faulty memory cell, said non-selection signal being input to a gate electrode of said selection transistor and causing said decoder output line to be unselected.

4. The semiconductor memory device of claim 3 wherein a subdecode signal for selecting one word line from a plurality of word lines that are connected to a said decoder output line and said non-selection signal are produced at the same time.

5. A semiconductor memory device as defined in claim 3 wherein said non-selection signal and a subdecode signal for selecting one word line from a plurality of word lines that are connected to the decoder output line are input to the decoder in an order such that the former is prior to the latter.

* * * * *